United States Patent [19]
Watanabe

[11] Patent Number: 5,099,151
[45] Date of Patent: Mar. 24, 1992

[54] BUFFER CIRCUIT FOR LOGIC LEVEL CONVERSION

[75] Inventor: Yuu Watanabe, Hadano, Japan

[73] Assignee: Fujitsu Limited, Kawasaki, Japan

[21] Appl. No.: 669,152

[22] Filed: Mar. 14, 1991

[30] Foreign Application Priority Data

Mar. 15, 1990 [JP] Japan ................... 2-65122

[51] Int. Cl.⁵ ................... H03K 19/017; H03K 19/20
[52] U.S. Cl. ................... 307/475; 307/448; 307/455
[58] Field of Search ................... 307/475, 455, 443, 448, 307/581, 585

[56] References Cited

U.S. PATENT DOCUMENTS

| | | | |
|---|---|---|---|
| 4,845,381 | 7/1989 | Cuevas ................... | 307/585 |
| 4,845,388 | 7/1989 | Amatangelo ................... | 307/585 |
| 5,015,888 | 5/1991 | Ovens ................... | 307/475 |
| 5,019,729 | 5/1991 | Kimura et al. ................... | 307/475 |
| 5,021,691 | 6/1991 | Saito ................... | 307/475 |

*Primary Examiner*—David Hudspeth
*Assistant Examiner*—Andrew Sanders
*Attorney, Agent, or Firm*—Armstrong, Nikaido, Marmelstein, Kubovcik & Murray

[57] ABSTRACT

A semiconductor interface circuit comprises a threshold circuit supplied with an input logic signal and an internal reference signal for discriminating the logic level thereof, and a reference circuit supplied with an external reference voltage for producing the internal reference signal. The threshold circuit comprises a first load, a first enhancement mode FET and a second load connected in series between a first power terminal and a second power terminal, wherein the internal reference signal is supplied to the gate of the first enhancement mode FET. Further, a first FET having a gate to which the input logic signal is supplied, is provided between the first and second power supply terminals. The first FET produces the output at the drain thereof. The reference circuit comprises a third load, a second enhancement mode FET and a fourth load connected in series between the first and second power terminals, wherein the drain and the gate are connected. Further, a second FET is provided across the first and second power terminals. The second FET is supplied with the reference voltage at a gate thereof, and the internal reference voltage is obtained at the drain of the second enhancement mode FET.

6 Claims, 10 Drawing Sheets

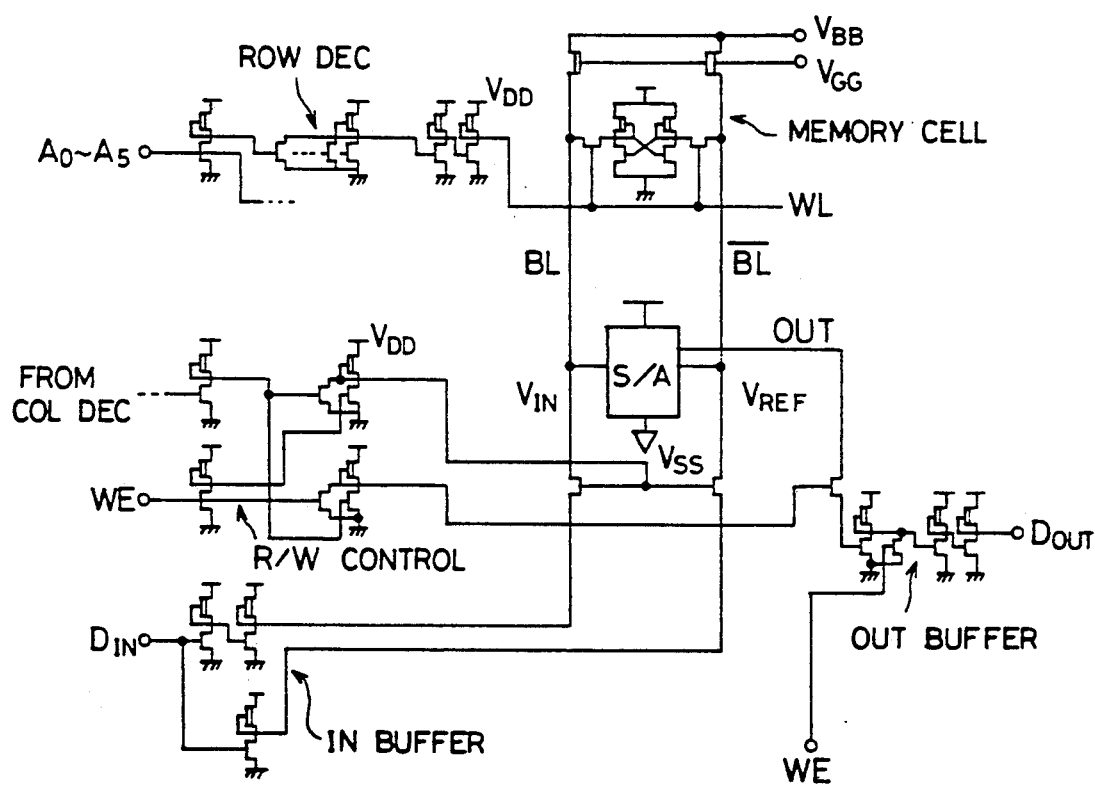
F I G. 13

BUFFER CIRCUIT FOR LOGIC LEVEL CONVERSION

BACKGROUND OF THE INVENTION

The present invention generally relates to semiconductor circuits and more particularly to a buffer circuit for logic level conversion.

In the digital signal processing, there often arises a case where a logic signal produced by a first semiconductor processor with a first logic level and amplitude has to be processed by a second semiconductor processor that operates based on the logic signal having a different logic level and amplitude. Such a situation arises, for example, when an output logic signal produced by an ECL circuit is processed by a circuit that employs the HEMT or vice versa. In such a case, it is necessary to interpose a buffer circuit between the first and second semiconductor circuits for logic level conversion such that a compatibility is achieved in the logic level of the signals.

FIGS. 1 and 2 show typical conventional buffer circuits wherein the circuit 10 of FIG. 1 has a level shift circuit 20 of the source-follower type combined with an inverter 30 having the DCFL construction, while the circuit 40 of FIG. 2 has a differential construction of the SCFL circuit.

Referring to FIG. 1, the level shift circuit 20 has a pair of depletion mode FETs 21 and 22 connected in series between the ground and a voltage source VEE1 that may provide a negative voltage of −3.6 volts, while the inverter circuit 30 has a depletion-mode FET 31 and an enhanced mode FET 32 connected in series between the ground and a second voltage source VEE2 that may provide a negative voltage of −2.0 volts. Thereby, the source of the FET 21 that is connected to the drain of the FET 22, is connected further to the gate of the FET 32. Further, the buffer circuit 10 has an input terminal IN connected to the gate of the FET 21 and an output terminal OUT connected to the source of the FET 31 that is connected to the drain of the FET 32. The FET 22 has the gate connected to its source and the FET 31 has the gate connected to is source.

In operation, the buffer circuit 10 is supplied with an ECL signal that assumes −1.5 volts in the low level state and −0.6 volts in the high level state. In response to the low level state of the input signal, the FET 21 is turned OFF and a voltage of −1.8 volts appears at a node $m$ between the FET 21 and FET 22, and the FET 32 is turned OFF. Thereby, an output voltage at the output terminal OUT takes a value of about zero volt. On the other hand, when the high level input signal is supplied at the input terminal IN, the FET 21 is turned ON and a voltage of about −0.9 volts appears at the node $m$. In response to this, the FET 32 is turned ON and an output voltage of about −2.0 volts appears on the output terminal OUT. Thereby, a desired level shift of the logic signal is achieved. In this circuit, the desired level shift is mainly achieved by the FET 21.

In this conventional buffer circuit 10, however, there is a problem in that, because of the back gate effect or so-called side gate effect, caused by the large negative voltage of −3.6 volts, the drain current of the FET 21 is changed from its designed value. Thereby, the voltage supplied to the inverter 30 is changed as shown in FIG. 3. In FIG. 3, the continuous line represents the designed input-output characteristic curve while the broken line represents the actual input-output characteristic. As can be seen in FIG. 3, the threshold voltage of the buffer circuit 10 shifts as indicated by the arrow from TH to TH'. When this occurs, the output logic signal of the buffer circuit 10 no longer represents the logic state of the input signal.

In the circuit of FIG. 2, on the other hand, the buffer circuit 40 has the differential SCFL construction, wherein a first branch circuit including a depletion mode FET 41 and an enhanced mode FET 42 connected in series and a second branch circuit including a depletion mode FET 43 and an enhanced mode FET 44 connected in series, are connected parallel with each other between the ground and a voltage source VEE1 via a depletion mode FET 45 that forms a common constant current source for the both branches. The gate of the FET 41 is connected to its source, the gate of the FET 43 is connected to its source, and the gate of the FET 45 is connected to its source. Thereby, the FETs 41, 43 and 45 are operated in the saturated region and act as the constant current source. To the gate of the FET 42, the input signal is supplied via an input terminal IN. Further, the FET 44 receives at its gate a reference signal $V_{REF}$. The output signal is obtained thereby at the source of the FET 41.

In operation, the voltage source VEE1 provides the negative voltage of −3.6 volts, and a voltage corresponding to the difference between the current flowing through the FETs 41 and 42 and the current flowing through the FETs 43 and 44, appears at the output terminal OUT in response to the input voltage supplied to the gate of the FET 42 via the input terminal IN. It should be noted that the FET 44, corresponding to the mirror image of the FET 42, is supplied with the constant reference voltage $V_{REF}$.

This circuit, too, shows the side gate effect because of the large negative voltage at the voltage source VEE1. As the circuit construction of the buffer circuit 40 is generally symmetric in the both branches, the side gate effect appears in the both FETs 42 and 44. Thereby, the change in the threshold voltage of the circuit 40 can be avoided.

FIG. 4 shows the input-output characteristic of the buffer circuit 40. In this drawing, too, the continuous line represents the designed input-output characteristic while the broken line represents the actual input-output characteristic.

As can be seen, the operational point or threshold level TH of the circuit 40 is determined as an intersection of a curve BR1 representing the input-output characteristic of the first branch and a curve BR2 representing the input-output characteristic of the second branch. When the side gate effect appears, both curves BR1 and BR2 shift in the downward direction as shown, and little change occurs in the threshold level TH. However, in terms of the level L representing the output logic level of the circuit 40, the threshold level of the buffer circuit that distinguishes the high level state from the low level state does change, from the level TH to the level TH' as illustrated. It should be noted that the output of the buffer circuit 40 is obtained from the first branch as illustrated. Thereby, the circuit 4 cannot provide satisfactory operation as the input buffer circuit.

SUMMARY OF THE INVENTION

Accordingly, it is a general object of the present invention to provide a novel and useful buffer circuit wherein the foregoing problems are eliminated.

Another and more specific object of the present invention is to provide a buffer circuit for logic level conversion, wherein the influence of the side gate effect on the operational characteristics is substantially eliminated.

Another object of the present invention is to provide a buffer circuit for logic level conversion comprising a threshold circuit supplied with an input signal for discriminating the logic level thereof, said threshold circuit having first and second generally symmetric branches each including a depletion mode FET and an enhancement mode FET, the first branch being supplied with the input logic signal and an internal reference voltage and producing a logic output in response to the comparison with the internal reference signal, the second branch being supplied with an external, fixed reference voltage and producing the internal reference voltage, wherein the first and second branches are constructed such that the internal voltage produced by the second branch includes the contribution of the side gate effect and such that the side gate effect on the operation of the first branch is canceled out by the contribution of the side gate effect included in the internal reference voltage. According to the present invention, the side gate effect of the FETs that causes the deviation in the operational characteristics of the threshold circuit is effectively compensated by the use of the internal reference voltage that includes the side gate effect.

Other objects and further features of the present invention will become apparent from the following detailed description when read in conjunction with the attached drawings.

BRIEF DESCRIPTION OF THE DRAWINGS

FIG. 13 is a circuit diagram showing an example of application of the present invention to the circuit other than the buffer circuit.

DETAILED DESCRIPTION

First, the principle of the present invention will be described with reference to FIG. 5.

Figure 1:
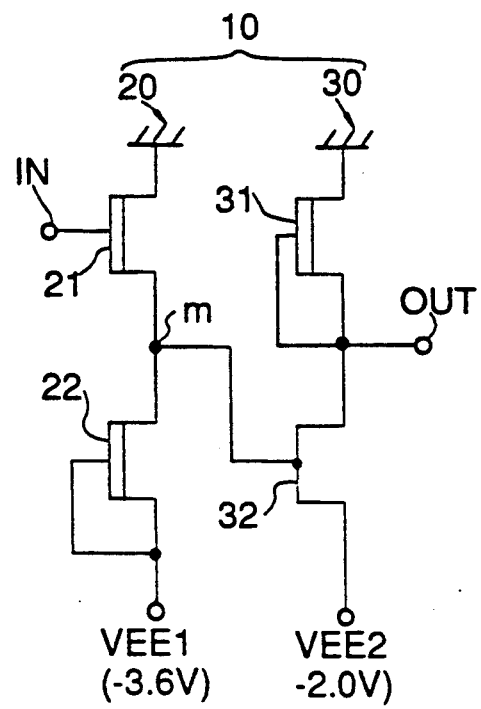
FIG. 1 is a circuit diagram showing a conventional buffer circuit.
Figure 2:
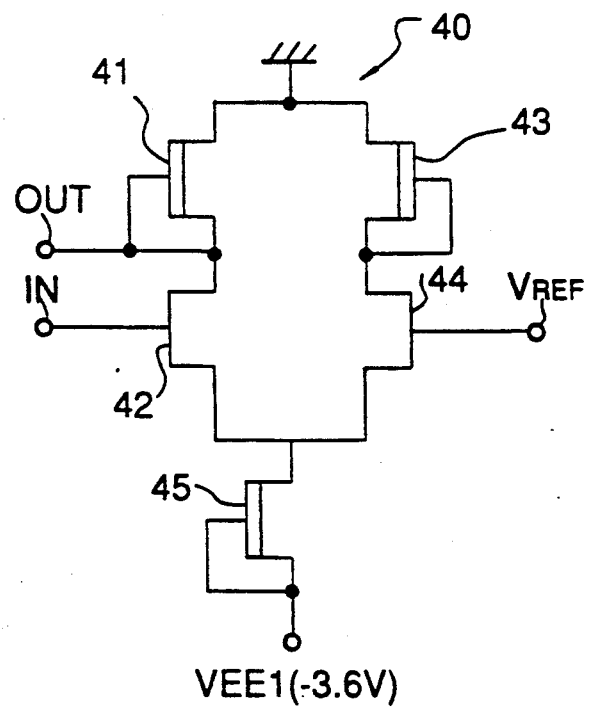
FIG. 2 is a circuit diagram showing another conventional buffer circuit.
Figure 3:
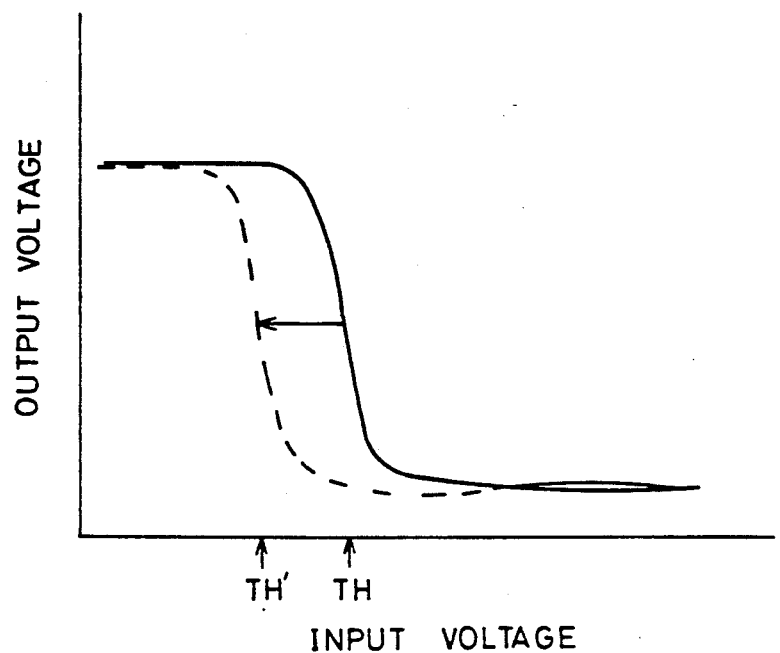
FIG. 3 is a diagram showing the operational characteristics of the buffer circuit of FIG. 1.
Figure 4:
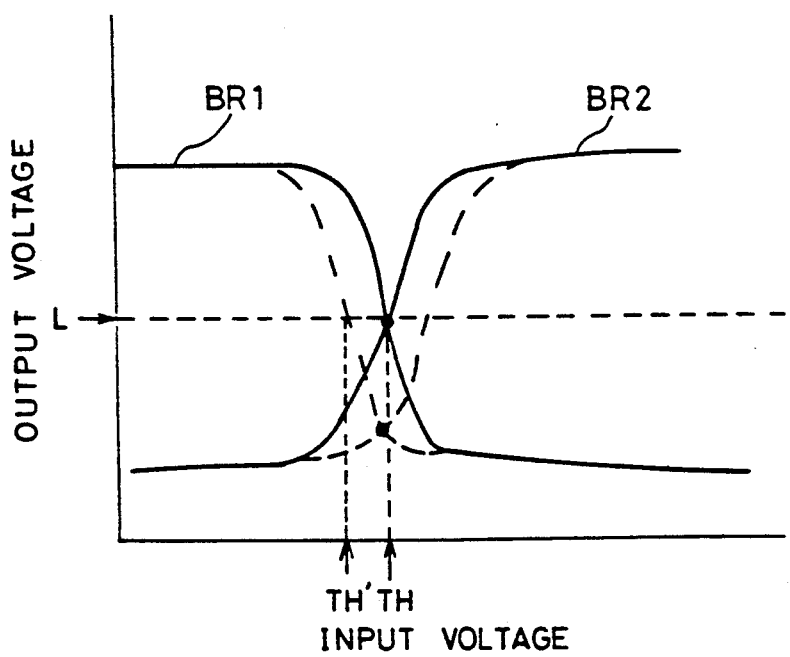
FIG. 4 is a diagram showing the operational characteristics of the buffer circuit of FIG. 2.
Figure 5:
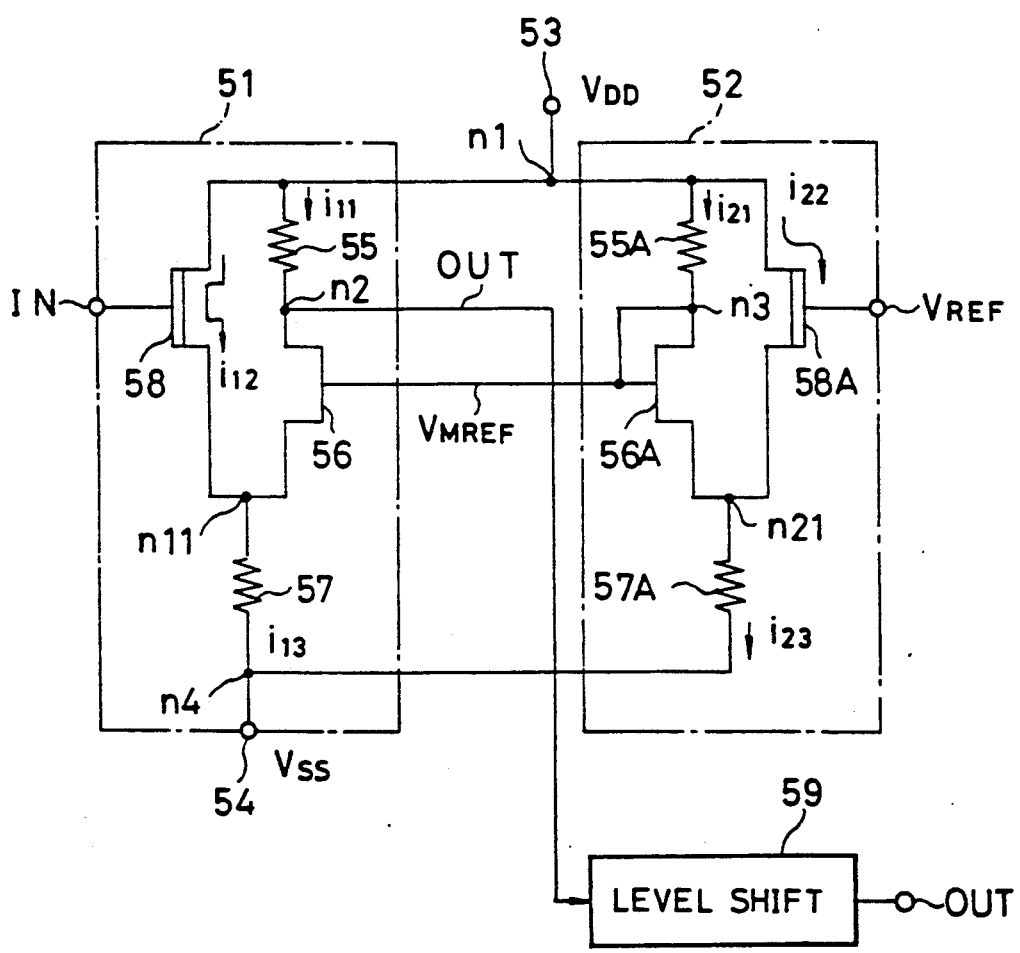
FIG. 5 is a circuit diagram showing the principle of the present invention.

Referring to FIG. 5, the buffer circuit of the present invention comprises a threshold circuit 50 that in turn comprises a first branch circuit 51 and a second branch circuit 52, and a level shift circuit 59.

The first branch circuit 51 includes a pull-up load 55, an enhancement mode FET 56 and a pull-down load 57 connected in series with the foregoing order between a first power terminal 53 supplying a first voltage $V_{DD}$ and a second Power terminal 54 supplying a second voltage $V_{SS}$, and a depletion mode FET 58 is connected parallel across the load 55 and the FET 56. The FET 58 has the gate to which an input terminal IN is connected for supplying an incoming input logic signal that may have the ECL level. On the other hand, an output signal OUT' of the threshold circuit is obtained at a node $n_2$ where the drain of the FET 56 is connected to the load 55.

In the second branch 52, a pull-up load 55A, an enhancement mode FET 56A and a pull-down load 57A are connected in series between the first power terminal 53 and the second power terminal 54 with a depletion mode FET 58A connected parallel across the load 55A and the FET 56A. Further, the drain of the FET 56A, connected to the load 55A at the node $n_3$, is connected to its gate, and the gate of the FET 56A is further connected to the gate of the FET 56. To the gate of the FET 58A, on the other hand, a reference voltage $V_{REF}$ is supplied from a constant reference voltage source. Further, the output OUT' of the threshold circuit is supplied to the level shift circuit 69.

Figure 7:
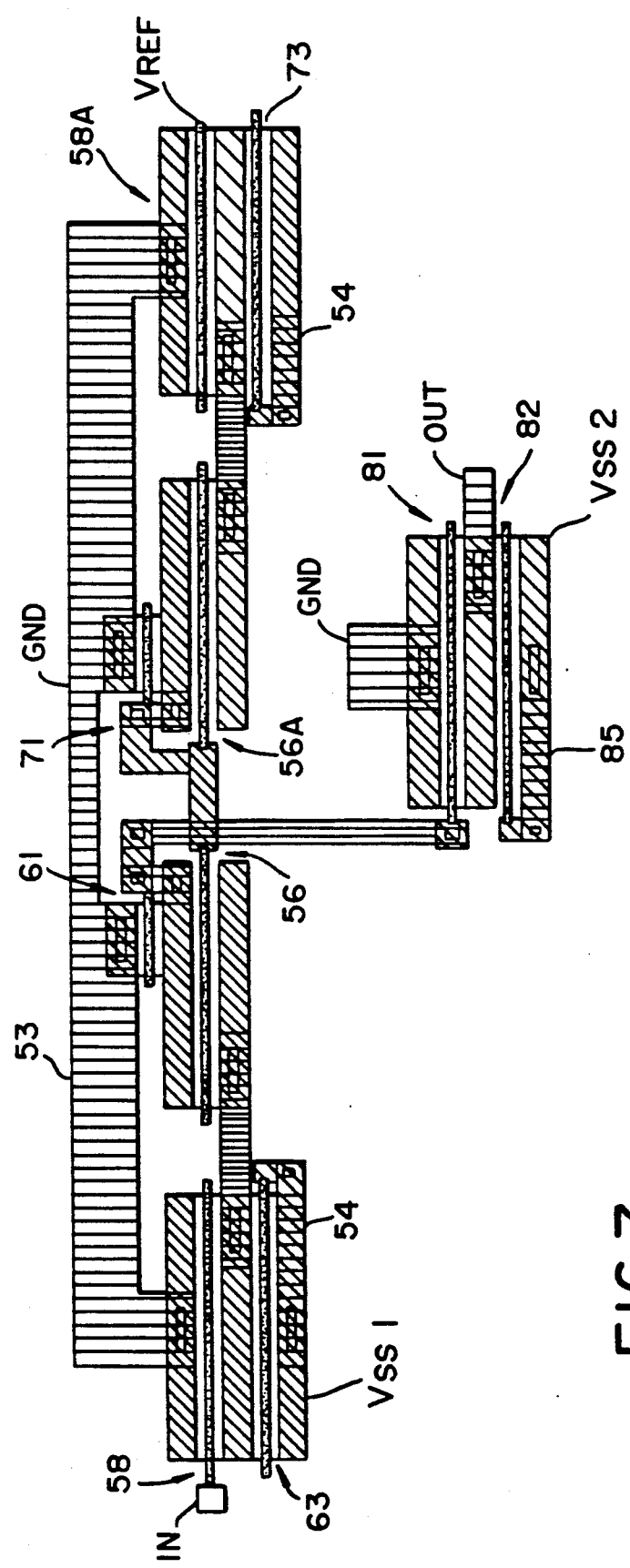
FIG. 7 is a diagram showing the layout of a part of the circuit of FIG. 6.

The circuit of FIG. 5 is constructed on a semiconductor chip in the form of integrated circuit as shown in the layout pattern of FIG. 7 for the first embodiment, wherein the first branch circuit 51 and the second branch circuit 52 are formed generally with a mirror-symmetric relationship including the gate length and gate width. Thereby, the FET 58A corresponding to the FET 58 has the gate length and gate width substantially identical with those of the FET 58. Similarly, the FET 56A corresponding to the FET 56 has the gate length and gate width substantially identical with those of the FET 56.

In operation, the current $i_{12}$ flowing through the depletion mode FET 58 is set substantially larger than the current $i_{11}$ flowing through the enhancement mode FET 56 by choosing the gate width appropriately. In other words, the current $i_{13}$ flowing through the load 57 is significantly larger than the current $i_{11}$ ($i_{11} < < i_{13}$). Similarly, the current $i_{22}$ flowing through the depletion mode FET 58A is substantially larger than the current $i_{21}$ flowing through the enhancement mode FET 56A. In other words, the current $i_{23}$ through the load 57A is significantly larger than the current $i_{21}$ ($i_{21} < < i_{23}$). As the FET 56A has the gate and drain shorted, the FET 56A is biased to the slightly turned ON state wherein the current $i_{21}$ assumes a small finite value not zero ($i_{21} \approx 0$).

Thereby, there appears a voltage of $VthE + \alpha$ between a node $n_3$ and a node $n_{21}$, where VthE represents the threshold voltage of the FET 56A and the parameter $\alpha$ is a small constant. This parameter $\alpha$ can be set insignificant by choosing a FET that has a turned ON current substantially smaller than the current $i_{21}$, for the FET 56A. On the other hand, a voltage of approximately equal to $V_{REF}$ appears at the node $n_{21}$ because of the condition of $i_{21} < < i_{23}$. Thus, the voltage $V_{MREF}$ on the line connecting the gate of the FET 56A to the gate of the FET 56 is represented as $$V_{MREF} = V_{REF} + V_{thE} + \alpha.$$

Here, it should be noted that the threshold level VthE of the FET 58A generally includes the contribution of the side gate effect caused by the large negative voltage $V_{ss}$, and may have a value that is different from the designed value.

In the first branch 51, a similar relationship holds. It should be noted that the voltage across the gate and source of the FET 56 is represented as $V_{MREF} - V_{11}$, where $V_{11}$ represents the voltage at a node $n_{11}$. From the condition of $V_{11} < < V_{IN}$ where $V_{IN}$ stands for the voltage at the input terminal IN, a relationship $V_{IN} \approx V_{11}$ holds. Thereby, the voltage across the gate and the source is represented as $$V_{MREF} \approx V_{thE'} + \alpha' + V_{IN}.$$

where VthE' represents the threshold level of the FET 56 and $\alpha'$ represents a parameter corresponding to the parameter $\alpha$ of the FET 56A. Again, it should be noted that the threshold VthE' includes the contribution of the side gate effect.

As the FET 58 and the FET 58A are constructed symmetric, the threshold voltage VthE is identical with the threshold voltage VthE', the parameter $\alpha$ identical with the parameter $\alpha'$. Thereby, the foregoing relationship can be written as $$V_{MREF} = V_{thE} + \alpha - V_{IN}.$$

Designating the voltage $V_{IN} = V_{REF} + x$, the gate-source voltage of FET 56 is now written as $$V_{MREF} - V_{11} \approx V_{REF} + V_{thE} + \alpha - V_{IN} = V_{thE} + \alpha - x.$$

Thus, when the input voltage $V_{IN}$ has exceeded the reference voltage $V_{REF}$ by $\alpha$. In other words, the threshold voltage of the circuit of FIG. 5 is represented as $V_{REF} + \alpha$, where the parameter $\alpha$ is small. It should be noted that the foregoing relationship holds for any value of $i_{11}$, $i_{12}$, $i_{21}$, $i_{22}$, provided that $i_{11} = i_{21}$, $i_{12} = i_{22}$ is satisfied. Thereby, the side gate effect, that induces a variation of the drain current, on the operation of the buffer circuit is eliminated.

Summarizing the foregoing, the voltage $V_{MREF}$ produced by the second branch circuit 52 in response to the fixed reference voltage $V_{REF}$ and supplied to the first branch circuit 51 as an internal reference voltage, is modified by the side gate effect. Thereby, the switching of the FET 56 in the first branch circuit 51, caused in response to the .PA input voltage supplied to the input terminal IN with respect to the internal reference voltage, is achieved while canceling out the side gate effect in the FET 56. It should be noted that the first branch circuit 51 and the second branch circuit 52 are constructed substantially with the mirror symmetry including the characteristics of each FET.

Figure 6:
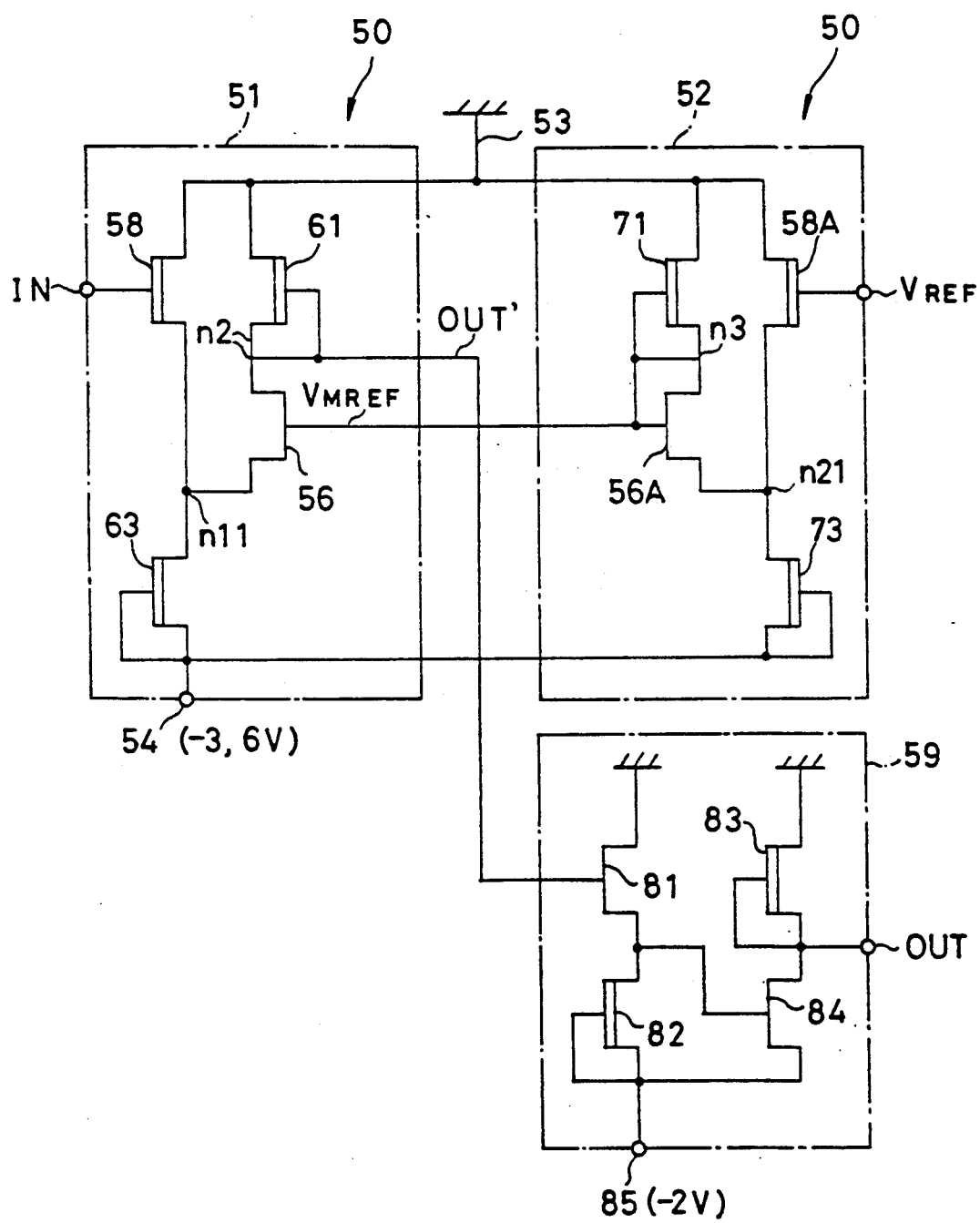
FIG. 6 is a circuit diagram showing the buffer circuit according to a first embodiment of the present invention.

Next, a first embodiment of the present invention will be described with reference to FIG. 6. In FIG. 6, those parts that have been described previously with reference to FIG. 5 are designated by the same reference numerals and the description there of will be omitted.

In the embodiment of FIG. 6, the loads 55 and 55A, and 57 and 57A shown as the resistance in FIG. 5, are replaced by FETs 61 and 71, and FETs 63 and 73. Thereby, the source and gate of each FET are shorted and the FETs 55, 55A, 57 and 57A operates in the saturated region as a constant current source.

Similar to the circuit of FIG. 5, the internal reference voltage $V_{MREF}$ is produced at the drain and thus at the gate of the FET 56A in response to the fixed reference voltage $V_{REF}$, and this internal reference voltage $V_{MREF}$ is used for the reference voltage for the threshold operation of the FET 56 in response to the input signal at the input terminal IN. Thereby, the side gate effect on each FET current is eliminated as already described. In this embodiment, the first voltage terminal 53 for the first source voltage $V_{DD}$ is grounded, while the second voltage terminal 54 for the second source voltage $V_{SS}$ is supplied with a negative voltage of $-3.6$ volts.

Further, the first embodiment of FIG. 6 shows the construction of the level shift circuit 59. As can be seen in FIG. 6, the level shift circuit 59 includes a pair of enhancement mode FET 81 and a depletion mode FET 82 connected in series between the ground and a voltage terminal 85 to which a negative voltage of $-2$ volts is supplied, wherein the depletion mode FET 82 has the gate and source shorted to form a constant current source. The output signal OUT' of the threshold circuit 51 is supplied to the gate of the enhancement mode FET 81 and, in response to the logic level of OUT', the FET 81 produces the output at the source thereof such that the output signal changes its level between a first voltage close to zero volt and a second, negative voltage determined by the FET 82. Further, another pair of depletion mode FET 83 and enhancement FET 84 connected in series are provided subsequent to the FET 81 and the FET 82 with a reversed sequence such that the turning ON and turning OFF of the FET 84 is controlled by the output from the FET 81. The operation of the level shift circuit 59 is well known and further description will be omitted. The output of the buffer circuit is obtained at the output terminal connected to the drain of the FET 84.

FIG. 7 shows a typical layout of the circuit of FIG. 6. Referring to FIG. 7, the region represented by the vertical lines shows the conductor pattern, the region represented by the hatching shows the source or drain electrode of FET, the horizontal thick bar represents the gate electrode, and the rectangular pattern shows the contact hole. From this layout, it will be understood that the FET 58 or FET 58A is located close to the conductor that forms the terminal 54. Thus, the FET 58 or 58A is extremely vulnerable to the side gate effect induced by the large negative Vss1 voltage, which is $-3.6$ volts. The distance between the terminal 54 and the FET 58 or 58A cannot be increased, as such an increase would cause an undesirable reduction of the integration density. As already noted, the present invention eliminates the side gate effect from the operational characteristics of the buffer circuit even when there is the side gate effect in the FETs forming the buffer circuit.

As can be seen clearly, the buffer circuit of FIG. 6 is constructed generally symmetrical not only in the circuit diagram but also in the layout pattern. As the enhancement mode FETs and the depletion mode FETs on the chip are formed simultaneously, it is guaranteed that the FETs that have the symmetric relationship have the same operational characteristic with each other. For example, it is guaranteed that the FET 58 has the characteristic that is identical with the characteristic of the FET 58A, the FET 56 has the characteristic that is identical with the characteristic of the FET 56A, and the like. In FIG. 7, it should be noted that the level shift circuit 59 includes only the FETs 81 and 82.

In a typical example, all the depletion mode FETs in the buffer circuit have the threshold voltage of −0.50 volts while all the enhancement mode FETs have the threshold voltage of 0.20 volts. Further, all the FETs have the gate length of 0.6 μm, while FETs 58, 58A, 56, 56A, 63, 73, 81 and 82 have the gate width of 20 μm, the FETs 61 and 71 have the gate width of 5 μm, the FET 83 has the gate width of 10 μm, and the FET 84 has the gate width of 14 μm.

Figure 8:
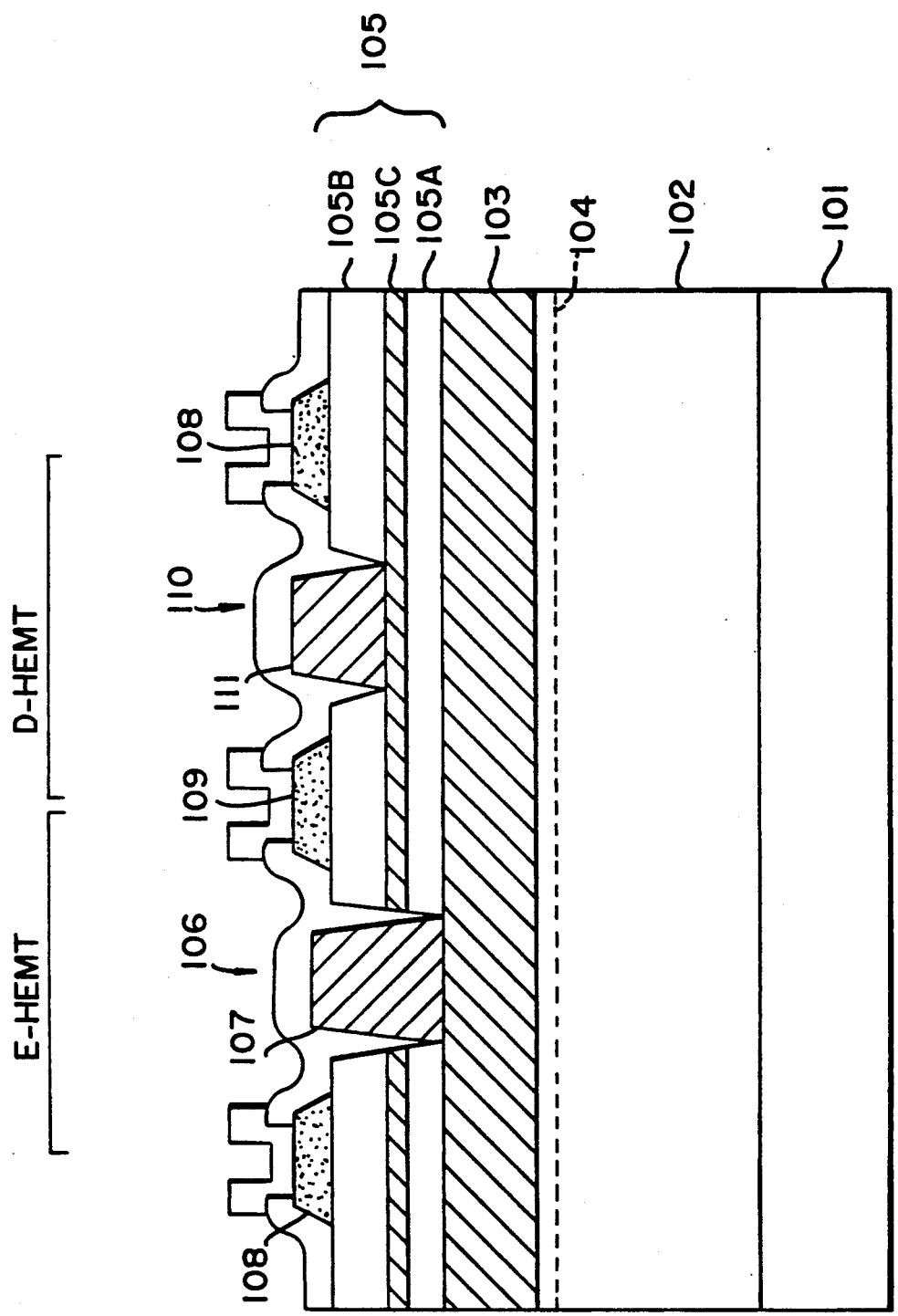
FIG. 8 is a diagram showing a typical cross section of the HEMT circuit wherein the enhancement mode FET and the depletion mode FET are connected in series.

FIG. 8 shows the cross section of the enhancement mode FETs and depletion mode FETs formed from the HEMT. It should be noted that these drawings show only the general structure of the enhancement mode HEMT and the depletion mode HEMT and not related to the particular part of FIG. 7.

Referring to FIG. 8, the enhancement mode HEMT is formed on a semi-insulating GaAs substrate 101 on which an undoped GaAs epitaxial layer 102 is grown. On the GaAs layer 102, a n-type AlGaAs layer 103 is grown directly or via a thin undoped AlGaAs layer (not illustrated). Thereby, a two-dimensional electron gas 104 is formed in the GaAs layer 102 along the boundary to the AlGaAs layer. On the layer 103, cap structure 105 comprising layers 105A and 105B of n-type GaAs is provided with an intervening layer 105C of n-type AlGaAs.

In the cap structure 105, a recess structure 106 is formed in correspondence to the gate electrode to expose the surface of the n-type GaAs layer 103, and a gate electrode 107 is provided in contact with the layer 103. Further, source and drain electrodes 108 and 109 are provided on the layer 105B as illustrated.

Further, the depletion mode HEMT is formed on the AlGaAs layer 103 by providing a gate recess 110 in correspondence to the gate of the depletion mode HEMT such that the layer 105C is exposed. In the exposed surface of the layer 105C, a gate electrode 111 is provided and the source and drain electrodes 108 and 109 are provided on the top surface of the cap layer 105B.

In such a structure, the formation of the two-dimensional electron gas under the gate electrode 106 and the gate electrode 110 is controlled in response to the gate voltage applied thereto, wherein the two-dimensional electron gas 104 is always formed under the gate electrode 111 of the depletion mode HEMT while the two-dimensional electron gas 104 is formed selectively in response to the gate voltage in the enhancement mode HEMT.

Figure 9:
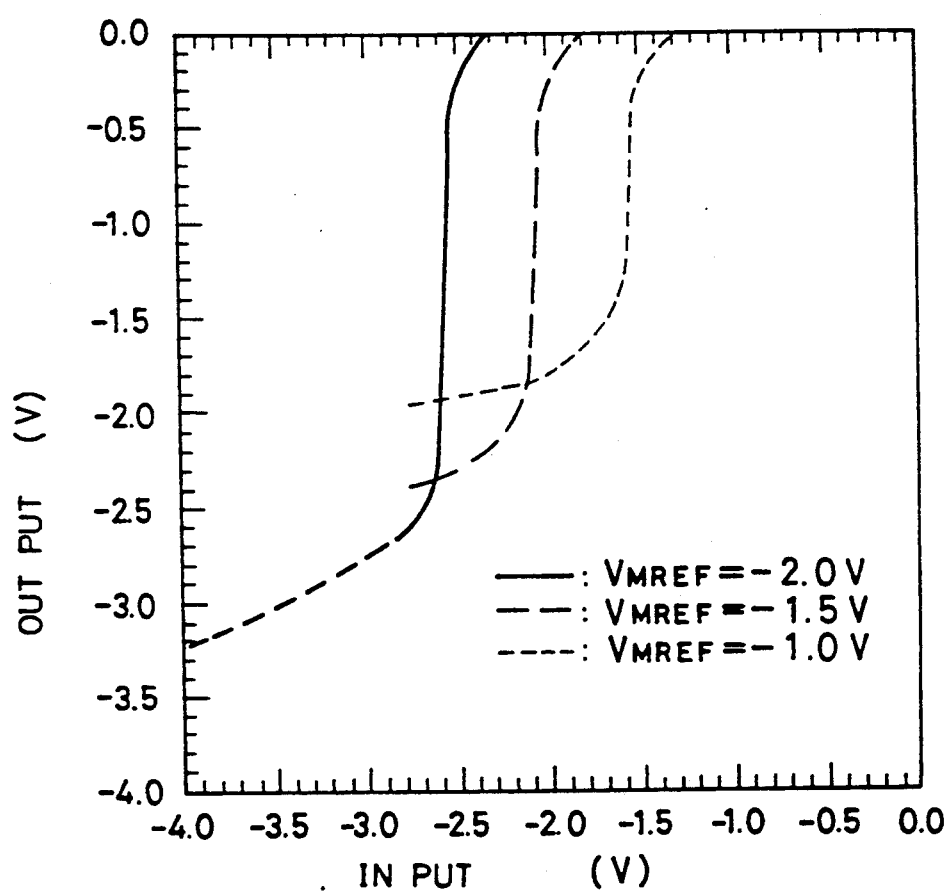
FIG. 9 is a diagram showing the operational characteristics of the threshold circuit included in the buffer circuit of FIG. 6.

FIG. 9 shows the result of simulation undertaken on the operation of the first branch circuit 51 of the threshold circuit 50. In FIG. 9, the transfer characteristic or input-output characteristic of the circuit 51 is shown while changing the level of the internal reference voltage $V_{MREF}$ as −2.0 volts, −1.5 volts and −1.0 volts. As can be seen, the threshold level of the circuit 51 changes clearly in response to the value of the $V_{MREF}$. It should be noted that this internal voltage is given by the second branch circuit 52 in response to the external reference voltage $V_{REF}$. As already noted, the value of the voltage $V_{MREF}$ includes the contribution of the side gate effect in the second branch circuit 52, and the side gate effect that occurs in the first branch circuit 51 is substantially canceled out, provided that the first branch circuit 51 and the second branch circuit 52 are formed substantially symmetrical.

Figure 10:
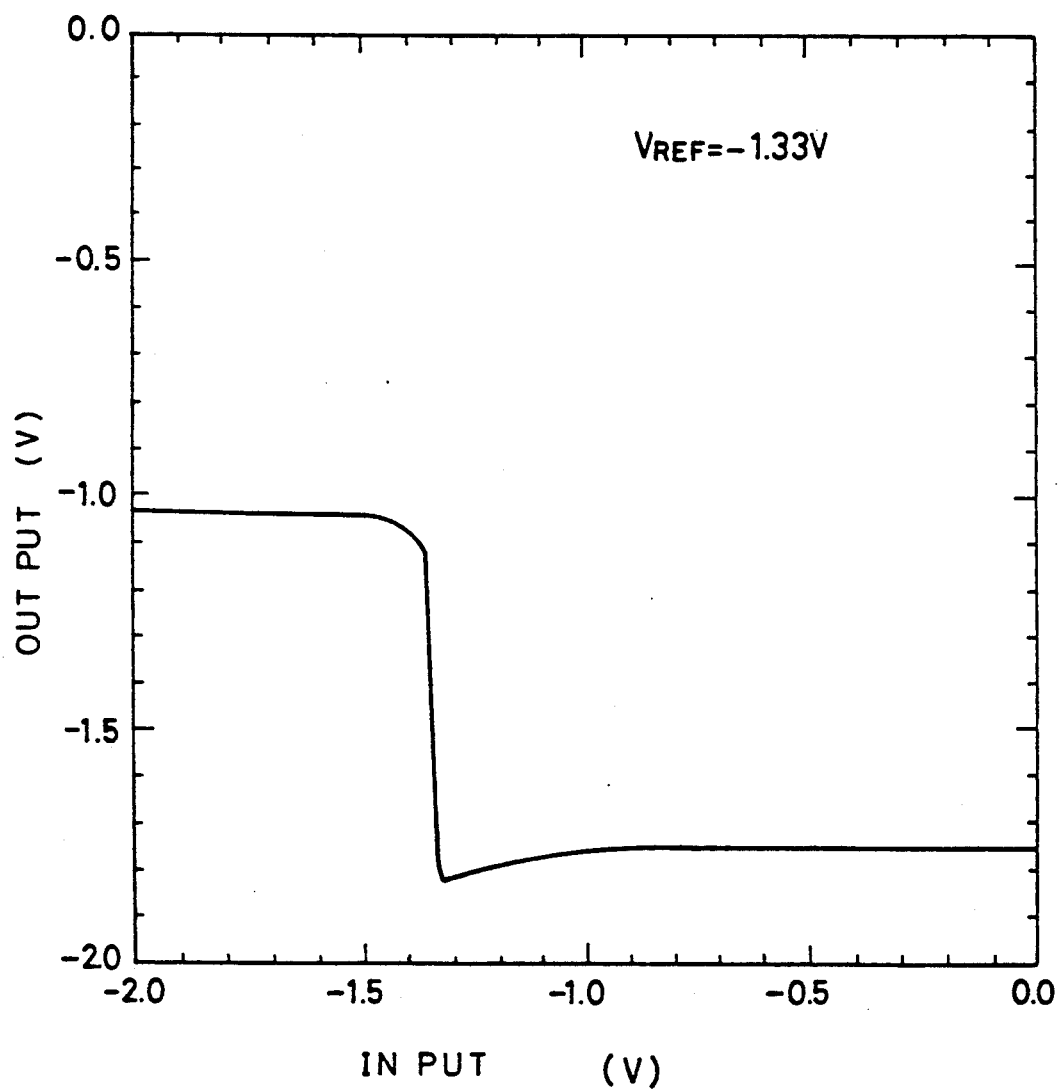
FIG. 10 is a diagram showing the overall operational characteristics of the buffer circuit of FIG. 6.

FIG. 10 shows the result of simulation undertaken for the buffer circuit of FIG. 6 under a fixed external reference voltage $V_{REF}$ of −1.33 volts. As can be seen, the threshold voltage for the buffer circuit is set at about −1.35 volts and the output logic signal changes its logic level between about −1.0 volts and −1.75 volts.

Figure 11:
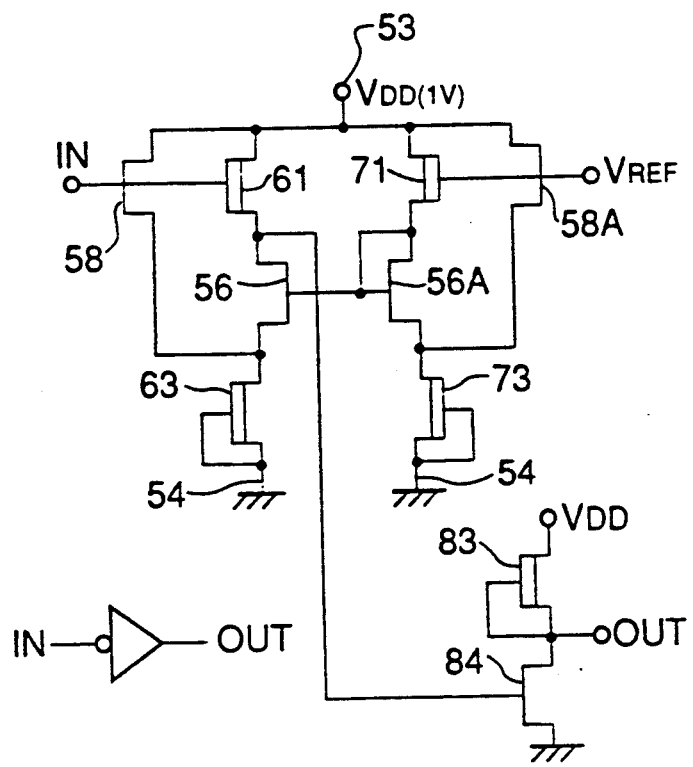
FIG. 11 is a circuit diagram showing a second embodiment of the present invention.

FIG. 11 shows a second embodiment of the present invention.

Referring to FIG. 11, the gate of the FET 58 and the gate of the FET 61 are connected commonly to the input terminal IN, while the gate of the FET 58A and the gate of the FET 71 are connected commonly to the terminal for the reference voltage $V_{REF}$. Further, in this embodiment, the power terminal 54 is grounded while the power terminal 53 is supplied with the drive voltage $V_{DD}$. In correspondence to this, the level shift circuit 59 comprises a series connection of the FET 83 and 84 as shown. Each FET in the present embodiment has the gate length of 0.6 μm while the FETs 61 and 71 have the gate width of 6 μm, the FETs 56 and 56A have the gate width of 15 μm, and the FETs 63 and 73 has the gate width of 30 μm. Other FETs have the gate width identical with the FETs in FIG. 6.

In this embodiment, the low level of the input logic signal at the input terminal IN not only causes the turning ON of the enhancement mode FET 56 because of the increased gate source voltage, but also causes the decrease in the current flowing through the FET 61. On the other hand, when the high level input signal is applied to the input terminal IN, the FET 56 is turned OFF while the FET 61 acts to increase the current flowing therethrough. In other words, the output voltage OUT' is lowered when the FET 56 is turned OFF, the voltage OUT' is increased when the FET 56 is turned ON. Thereby, the gain of the first circuit branch 51 is increased. As a result, the circuit of FIG. 11 can operate with the reduced power voltage such as $V_{DD}$ of less than 1 volt. It should be noted that the circuit of FIG. 11 operates as an inverting type buffer amplifier as symbolically shown in the drawing. Further, it should be noted that FET 58 or 58A in this embodiment is the enhancement mode field effect transistor. Generally, both the depletion mode FET and the enhancement mode FET can be used for the FETs 58 and 58A.

Figure 12:
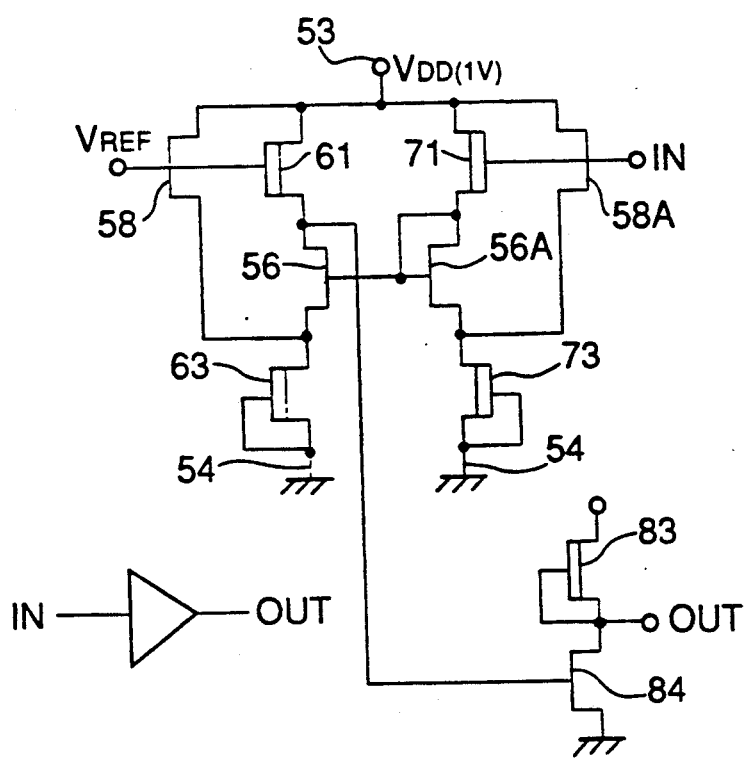
FIG. 12 is a circuit diagram showing a modification of the second embodiment.

FIG. 12 shows a modification of the circuit of FIG. 11 wherein the input logic signal and the reference voltage $V_{REF}$ are reversed. In this case, the circuit operates as a non-inverting type buffer amplifier as shown in the drawing. As the construction and operation for this modification is obvious, further description thereof will be omitted.

It should be noted that the application of the buffer circuit described heretofore is not limited the buffer circuit for the logic level conversion but can be used for other purposes.

FIG. 13 shows an example of such an application, wherein the buffer circuit of the present invention is used for the sense amplifier S/A of a SRAM circuit.

Referring to FIG. 13, the SRAM circuit has a well known construction of input buffer circuit, read/write control circuit, row decoder, memory cell, sense amplifier and an output buffer circuit. Each of these circuits, except for the sense amplifier, has a well known construction of HEMT LS1 and may be the one proposed by Kuroda et al., IEEE GaAs IC Symp., Oct. 1984, pp.125-128, which is incorporated herein as reference.

In the circuit of FIG. 13, the sense amplifier S/A is replaced by the threshold circuit 50 of FIG. 6. Thereby, the bit line BL is connected to the input terminal IN while the bit line $\overline{BL}$ is connected to the input terminal $V_{REF}$. Thereby, the circuit 50 picks up the voltage difference across the bit line BL and the bit line $\overline{BL}$ and outputs the same to the output buffer circuit after amplification.

Further, the present invention is not limited to the embodiments described heretofore, but various variations and modifications may be made without departing from the scope of the invention.

What is claimed is

1. A semiconductor interface circuit supplied with an input logic signal having either a first logic level or a second, different logic level, for producing an output logic signal in correspondence to the logic level of the input signal, comprising:

a threshold circuit supplied with the input logic signal and an internal reference signal for discriminating the logic level thereof based upon a comparison of the logic level of the input logic signal and the internal reference signal and producing the output logic signal in response to the result of comparison;

a reference circuit supplied with an external reference voltage for producing the internal reference signal;

a first power supply terminal for receiving a first power voltage; and a second power supply terminal for receiving a second power voltage that is lower than the first power voltage;

said threshold circuit comprising first load means having a first end connected to the first power supply terminal and a second end, a first enhancement mode field effect transistor having a drain connected to the second end of the first load means, a gate connected to the reference circuit for receiving the internal reference signal and a source, second load means having a first end connected to the source of the first enhancement mode field effect transistor and a second end connected to the second power supply terminal, and a first field effect transistor having a gate supplied with the input logic signal, a drain connected to the first power supply terminal and a source connected to the second power supply terminal, said threshold circuit producing the output logic signal at the drain of the enhancement mode field effect transistor;

said reference circuit comprising third load means having a first end connected to the first power supply terminal and a second end, a second enhancement mode field effect transistor having a drain connected to the second end of the third load means, a gate connected to the drain of the second enhancement mode field effect transistor and further to the gate of the first enhancement mode field effect transistor and a source, said second enhancement mode field effect transistor producing the internal reference signal at the drain thereof, fourth load means having a first end connected to the source of the second enhancement mode field effect transistor and a second end connected to the second power supply terminal, and a second field effect transistor having a gate supplied with the external reference voltage, a drain connected to the first power supply terminal and a source connected to the second power supply terminal.

2. A semiconductor circuit as claimed in claim 1 in which said first enhancement mode field effect transistor has a characteristic substantially identical with the second enhancement mode field effect transistor, and said first field effect transistor has a characteristic substantially identical with the second field effect transistor.

3. A semiconductor circuit as claimed in claim 1 in which said reference circuit and said threshold circuit are formed on a same semiconductor chip with substantially symmetric relationship such that said reference circuit forms a mirror image of the threshold circuit, except for the interconnection of the drain and the gate of the second enhancement mode field effect transistor.

4. A semiconductor circuit as claimed in claim 3 in which said first enhancement mode field effect transistor has a gate length and a gate width that are identical with those of the second enhancement mode field effect transistor of the reference circuit, and said first field effect transistor has a gate length and a gate width that are identical with those of the second field effect transistor.

5. A semiconductor circuit as claimed in claim 1 in which said first load means comprises a first depletion mode field effect transistor having a drain in correspondence to the first end of the first load means connected to the first power supply terminal and a source in correspondence to the second, opposing end connected to the drain of the first enhancement mode field effect transistor, said first depletion mode field effect transistor having a gate connected to the source thereof to form a constant current source, said second load means comprises a second depletion mode field effect transistor having a drain in correspondence to the first end of the second load means connected to the source of the first enhancement mode field effect transistor and a source in correspondence to the second, opposing end connected to the second power supply terminal, said second depletion mode field effect transistor having a gate connected to the source thereof to form a constant current source, said third load means comprises a third depletion source, said third load means comprises a third depletion mode field effect transistor having a drain in correspondence to the first end of the third load means that is connected to the first power supply terminal and a source in correspondence to the second, opposing end connected to the drain of the second enhancement mode field effect transistor, said third depletion mode field effect transistor having a gate connected to the source thereof to form a constant current source, and said fourth load resistance means comprises a fourth depletion mode field effect transistor having a drain in correspondence to the first end of the fourth load means connected to the source of the second enhancement mode field effect transistor and a source in correspondence to the second, opposing end of the fourth load means connected to the second power supply terminal, said fourth depletion mode field effect transistor having a gate connected to the source thereof to form a constant current source.

6. A semiconductor circuit as claimed in claim 5 in which said first load means comprises a first depletion mode field effect transistor having a drain in correspondence to the first end of the first load means connected to the first power supply terminal and a source in correspondence to the second, opposing end connected to the drain of the first enhancement mode field effect transistor, said first depletion mode field effect transistor having a gate connected commonly to the gate of the field effect transistor for receiving the input logic signal, said second load means comprises a second depletion mode field effect transistor having a drain in correspondence to the first end of the second load means connected to the source of the first enhancement mode field effect transistor and a source in correspondence to the second, opposing end connected to the second power supply terminal, said second depletion mode field effect transistor having a gate connected to the source thereof to form a constant current source, said third load means comprises a third depletion mode field effect transistor having a drain in correspondence to the first end of the third load means that is connected to the first power supply terminal and a source in correspondence to the second, opposing end connected to the drain of the second enhancement mode field effect transistor, said third depletion mode field effect transistor having a gate connected commonly to the gate of the second field effect transistor for receiving the reference voltage, and said fourth load resistance means comprises a fourth depletion mode field effect transistor having a drain in correspondence to the first end of the fourth load means connected to the source of the second enhancement mode field effect transistor and a source in correspondence to the second, opposing end of the fourth load means connected to the second power supply terminal, said fourth depletion mode field effect transistor having a gate connected to the source thereof to form a constant current source.

* * * * *